(12) United States Patent
Wilson

(10) Patent No.: US 8,232,135 B2
(45) Date of Patent: Jul. 31, 2012

(54) ORGANIC TRANSISTOR

(75) Inventor: Richard Wilson, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 569 days.

(21) Appl. No.: 11/665,462

(22) PCT Filed: Oct. 12, 2005

(86) PCT No.: PCT/GB2005/003920
§ 371 (c)(1),
(2), (4) Date: Nov. 7, 2007

(87) PCT Pub. No.: WO2006/040548
PCT Pub. Date: Apr. 20, 2006

(65) Prior Publication Data
US 2008/0164461 A1 Jul. 10, 2008

(30) Foreign Application Priority Data
Oct. 15, 2004 (GB) .................................. 0423006.6

(51) Int. Cl.
*H01L 51/40* (2006.01)
(52) U.S. Cl. ............................................ 438/99; 257/40
(58) Field of Classification Search .................... 257/40; 438/99
See application file for complete search history.

(56) References Cited

U.S. PATENT DOCUMENTS

| 5,500,537 | A | 3/1996 | Tsumura et al. | |
|---|---|---|---|---|
| 2003/0059984 | A1* | 3/2003 | Sirringhaus et al. | ........... 438/141 |
| 2004/0108562 | A1 | 6/2004 | Nagayama et al. | |
| 2007/0120095 | A1* | 5/2007 | Gruner | ........................ 252/500 |

FOREIGN PATENT DOCUMENTS

| EP | 0 716 459 | 11/1997 |
|---|---|---|
| JP | 2004-260121 | 9/2004 |
| WO | WO-96/20253 | 7/1996 |
| WO | WO-99/54385 | 10/1999 |
| WO | WO-00/65653 | 11/2000 |
| WO | WO-00/79617 | 12/2000 |
| WO | WO-01/46987 | 6/2001 |
| WO | WO-01/47043 | 6/2001 |
| WO | WO-01/47044 | 6/2001 |

(Continued)

OTHER PUBLICATIONS

Brown et al., "A Universal Relation Between Conductivity and Field-Effect Mobility in Doped Amorphous Organic Semiconductors," *Synthetic Metals*, 68(1):65-70 (1994).

(Continued)

*Primary Examiner* — Anthony Ho
(74) *Attorney, Agent, or Firm* — Marshall, Gerstein & Borun LLP

(57) ABSTRACT

An organic transistor comprising source and drain electrodes; a gate electrode; an organic insulating layer between the gate electrode and the source and drain electrodes; and an organic semiconductive region between the insulating layer and the source and drain electrodes; wherein the organic semiconductive region comprises (a) a high mobility layer of an organic semiconductor and (b) a blocking layer of organic material positioned between the high mobility layer and the source and drain electrodes, in which the ionization potential of the organic material of the blocking layer exceeds the workfunction of the source and drain electrodes so as to inhibit charge injection from the source electrode into the blocking layer in the off-state.

14 Claims, 2 Drawing Sheets

FOREIGN PATENT DOCUMENTS

| WO | WO-01/47045 | 6/2001 |
|---|---|---|
| WO | WO-2004/023573 | 3/2004 |

OTHER PUBLICATIONS

Brown et al., "Field Effect Transistors Made from Solution-Processed Organic Semiconducts." *Synthetic Metals*, 88:37-55 (1997).

Gundlach et al., "Pentacene Thin Film Transistors With Improved Linear Region Characteristics Using Chemically Modified Source and Drain Electrodes," *TN IEEE Electron Device Lett.*, 22(12):571-573 (2001).

Kim et al., "Improved Contact Properties for Thin-Film Transistors Using Self-Assembled Monolayer," *Japanese Journal of Appl. Phys. Part 2—Lett.*, 43(A1-B):L60-L62 (2004).

Combined Search and Examination Report for Application No. GB0423006.6 dated Feb. 4, 2005.

International Preliminary Report on Patentability for International Application No. PCT/GB2005/003920, dated Apr. 17, 2007.

International Search Report for International Application No. PCT/GB2005/003920, dated May 4, 2006.

Written Opinion tor International Application No. PCT/GB2005/003920, dated May 4, 2006.

* cited by examiner

ORGANIC TRANSISTOR

This is the U.S. national phase of International Application No. PCT/GB2005/003920 filed Oct. 12, 2005, the entire disclosure of which is hereby incorporated herein by reference.

BACKGROUND

1. Field of the Invention

The invention concerns a new organic transistor and a method for making the same.

2. Related Technology

Field-effect transistors (FETs), are three-terminal devices that comprise a source contact, a drain contact, and a gate contact. According to a basic structure, a semiconductive layer bridges the source and drain contacts, and is itself spaced from the gate contact by an insulating layer called the gate dielectric. In the on state, a "channel" is created in the semiconductive layer through which charges pass from the source electrode to the drain electrode. In organic transistors, the semiconductive layer is fabricated from a semiconductive organic material. In particular, in polymer transistors, the semiconductive organic layer is fabricated from a semiconductive polymer, typically a n-conjugated organic polymer. This layer may be deposited in the device by a precursor route or directly by solution processing.

A voltage is applied across the source contact and the drain contact. Further, in a field effect transistor, a voltage is applied to the gate contact. This voltage creates a field that alters the current-voltage characteristics of the semiconductive layer by causing accumulation or depletion of charge carriers there. This in turn modulates the channel resistance and the rate at which charges pass from the source to the drain contact (that is, the source-drain current) for a given source-drain voltage.

In principle, organic field effect transistors (FETs) can operate in two modes; either as an n-channel device (where the charges accumulated in the channel are electrons) or a p-channel device (where the charges accumulated in the channel are holes).

Organic field effect transistors (FETs) can be fabricated in two configurations: a top-gate configuration or a bottom gate configuration.

FETs having a multilayer device structure, with layers beyond the basic structure outlined above, are known from WO 01/47043, WO 01/47044, WO 01/047045, and WO 01/46987.

WO 01/47043 is concerned with solution processed transistors. A method is provided for forming a transistor comprising depositing a first material from solution using a first solvent to form a first layer of the transistor; and subsequently while the first material remains soluble in the first solvent, forming a second layer of the transistor by depositing over the first material a second material from solution in a second solvent in which the first material is substantially insoluble. The method maintains the integrity of the layer sequence during device manufacture.

WO 01/47044 is concerned, in one aspect, with locally depositing solvents at a localised region of the insulating layer so as to dissolve the sequence of insulating and semiconducting layers in the region to leave a void extending through the sequence of layers; and depositing conductive or semiconductive material in the void. It is said that the material deposited in the void may form a via hole interconnect between electrodes and/or interconnect lines in different layers of the device. In another aspect, WO 01/47044 discloses locally depositing a diffusive dopant from solution at a localised region of the insulating layer so as to modify the insulating and semiconductive layers in the region and thereby form a channel of electrically conductive material extending through the sequence of layers. Again it is said that the channel may form a via hole interconnect between electrodes and/or interconnect lines in different layers of the device.

WO 01/47045 is concerned with a confinement technique which can be used to permit fine resolution deposition of a deposited material onto a substrate. In particular, the confinement technique is disclosed for forming the source and drain electrodes of a transistor.

WO 01/46987 is concerned with forming at least part of a transistor by ink jet printing.

All of WO 01/47043, WO 01/47044, WO 01/047045, and WO 01/46987 disclose a transistor having the basic structure defined above. That is to say, the transistors have a source contact, a drain contact, a gate contact, a semiconductive layer, and an insulating layer. It is further said that the devices may include an isolation layer. The isolation layer may provide a diffusion barrier and/or a surface modification layer. The diffusion barrier layer protects the semiconducting layer and the insulating layer against unintentional doping by impurities and ionic diffusion. The ionic impurities are believed to originate from the PEDOT gate electrode. The surface modification layer enables high resolution patterning of the gate electrode by printing techniques. According to page 10 of WO 01/47043, the isolation layer is between the insulator and the gate electrode.

The device structures according to FIG. 1 of WO 01/47043 show a diffusion barrier layer (7) and a surface modification layer (8) between the insulating layer (5) and the gate electrode (6) for a device in top gate configuration. The device structure shown in FIG. 17 shows a diffusion barrier layer (7) and a surface modification layer (8) between the insulating layer (5) and source-drain electrodes (2), (3) and the semiconducting layer (4) for a device in bottom gate configuration.

An alignment layer also is disclosed in WO 01/47043, WO 01/47044, WO 01/047045, WO 01/46987, and WO 00/79617 such as a mechanically rubbed polyimide layer. The alignment layer is coated on the glass substrate prior to depositing the semiconducting polymer layer. The alignment layer is used to align the polymer chains of the semiconducting polymer to improve charge carrier mobility.

It is also disclosed that to achieve high current switching ratios it is important that a polymer semiconductor is used with good stability against unintentional doping by oxygen or water during device manufacture. Thus, the desirability of a high switching ratio (on-off current ratio) is mentioned in WO 01/47043, WO 01/47044, WO 01/047045, and WO 01/46987. The on-off current ratio is the ratio between the current in the on state (the on current) and the current in the off state (the off current). A high on-off current ratio means there is a good difference between the on state and the off state of the device, which means better switching characteristics of the device. A low on-off current ratio means that it is difficult to turn the transistor off because current passes between the source and drain in the off state. It may also be difficult to turn the transistor on because a low mobility semiconductor means that little current is passed in the on-state. To maximise the on-off current ratio, the off current should be low and the on current should be high. One possibility known in the art for increasing the on current is to use a semiconducting material having a high mobility. According to WO 01/47043, WO 01/47044, WO 01/047045, and WO 01/46987, TFB is a suitable material for use as the semiconducting polymer (see for example page 6 of WO 01/47043).

The PhD thesis of Richard Wilson (University of Cambridge, 2003) shows that a TFB single layer device with gold source and drain electrodes is not commercially viable since TFB has too low a charge carrier mobility. However, this thesis also shows that the gold source and drain electrodes form resistive contacts to TFB.

SUMMARY

The inventors have identified that forming resistive contacts between the source and drain electrodes and the semiconducting layer can be advantageous in order to lower the off-current of the device. This is because the resistive contacts inhibit charge injection into the semiconducting layer when the device is in the off state. As explained above, a low off-current combined with a high on-current leads to a device with a desirably high on-off current ratio.

In view of the above, the present inventors have identified that an improved device with a high on-off current ratio could be made if one could improve the charge mobility of a semiconducting polymer such as TFB which forms advantageous resistive contacts with the source and drain electrodes in a transistor but which has a charge mobility that this too low for commercial transistors.

Much work has been published showing that doping the semiconducting polymer enhances the charge mobility (Synthetic Metals 68, 65-70, 1994 and Synthetic Metals 88, 37-55, 1997). However, whilst doping increases the mobility, it also increases the conductivity of the polymer. Thus, for a doped single active layer thin film transistor, the off-current increases thereby precluding any significant increase in the on-off current ratio. In fact, increasing the mobility by doping was shown to decrease the on-off ratio in the above paper. Therefore, the mobility of the semiconducting material presents particular problems for an organic semiconducting material.

Therefore, there exists a need to provide a means for improving the charge mobility of a semiconducting polymer such as TFB which forms advantageous resistive contacts with the source and drain electrodes in a transistor but which has a charge mobility that is too low for commercial transistors.

Alternatively, there is a need to provide a means of incorporating a high mobility material, possibly doped, into a transistor structure with resistive contacts to the source and drain.

The invention aims to at least partially address this need and to provide an improved transistor utilizing a semiconducting polymer in the semiconducting layer, which inhibits charge injection into the semiconducting layer, preferably by forming resistive contacts with the source and drain electrodes.

DETAILED DESCRIPTION

The invention provides, in a first aspect, an organic transistor comprising source and drain electrodes, a gate electrode, an organic insulating layer between the gate electrode and the source and drain electrodes and an organic semiconductive region between the insulating layer and the source and drain electrodes, wherein the organic semiconductive region comprises (a) a high mobility layer of an organic semiconductor and (b) a blocking layer of organic material positioned between the high mobility layer and the source and drain electrodes, in which the ionization potential of the organic material of the blocking layer exceeds the workfunction of the source and drain electrodes so as to inhibit charge injection from the source electrode into the blocking layer in the off-state.

The present bilayer construction allows the use of materials whose mobility has been increased by doping (where the conductivity also increases as a bi-product, which would under 'standard' device structure give a large off current and low on-off current ratio).

The mobility can be extracted from transfer characteristic measurements performed on the complete transistor (measuring the source-drain current, while sweeping the gate bias and keeping the source and drain bias' fixed). Conductivity can be measured using a four-point probe measurement.

In the off-state there is close to zero volts bias between the gate electrode (at ~0V) and the source contact (at 0V) [the drain electrode is at $-V_{drain}$ V in the off-state]. In the on-state, there is a large bias between the gate contact ($-V_{gate}$) and the source contact (at 0V) [the drain contact remains at $-V_{drain}$]. It is this large source-drain bias which allows/drives charges to inject from the source contact into the organic semiconductive layer The off-state is characterized by a gate-voltage below the threshold required to induce free-charges at the semiconductor/dielectric interface. Usually, one has to apply a voltage of −1 to −5 V to induce these free charges.

In the present transistor, the semiconductive region comprises a bi-layer.

The present transistor has a low-off current because the blocking layer inhibits current when the device is in the off state due to the ionization potential of the organic material exceeding the workfunction of the source and drain electrodes. This is because the blocking layer inhibits charge injection into the high mobility layer when the device is in the off state. This represents a departure from previous thinking where modification of the source/drain electrodes has been researched to improve injection into small molecule transistors (see Gundlach D J, Jia L L, Jackson T N IEEE ELECTRON DEVICE LETTERS 22 (12): 571-573 DECEMBER 2001 & Kim S H, Lee J H, Lim S C, Yang Y S, Zyung T JAPANESE JOURNAL OF APPLIED PHYSICS PART 2-LETTERS 43 (1A-B): L60-L62 JAN. 15 2004).

For a low off-current, $I_{off}$×length of the transistor L/width of transistor W preferably has a value of about $10^{-15}$ A.m.m$^{-1}$ (amp meters per meter).

The present transistor further has a high on-current due to the high mobility layer. Scaling the on-current with the length and width of the transistor (I×L/W), $10^{-10}$ A.m.m$^{-1}$ can be said to be a high on-current. This corresponds to a on-off current ratio of $10^5$. Higher on-off ratios of the order $10^7$ or $10^8$ are however obtainable in accordance with the invention. In the on state, the gate voltage is large and negative. Specific values depend on device geometry/material choice/thickness of insulator etc. When a voltage is applied across the source and drain electrodes, holes are attracted to the interface between the high mobility layer and the insulating layer forming a thin, highly conductive accumulation channel in the high mobility layer. Holes are then injected from the source electrode (held at zero voltage), across the blocking layer and the high mobility layer to the accumulation channel. At the drain side of the channel the holes travel back across the high mobility layer and the blocking layer and are extracted from the device through the drain electrode.

The combination of a low off-current and a high on-current enables a high on-off current ratio. Thus, the present transistor enables a doped high mobility semiconductor to be used in a device with a high on-off current ratio. On-off current ratios that can be expected to be achieved with the present transistor are at least $10^6$, or even at least $10^8$.

The present transistor can be in top gate or bottom gate configuration. However, top gate configuration is preferred. In bottom gate configuration, optionally the high-mobility layer is crosslinked.

The blocking layer preferably forms resistive contacts with the source and drain electrodes when the device is in the off state. In the on-state the contacts have a reduced blocking effect because there is a larger bias between the source and the gate electrode. The appearance of non-linearities in the output characteristics at low drain bias is an indication that resistive contacts have been formed.

The ionization potential of the organic material in the blocking layer exceeds the workfunction of the source and drain electrodes. Preferably, the ionization potential of the organic material is greater than 5.1 eV, more preferable greater than 5.2 eV.

The organic material of the blocking layer preferably comprises a polymer. Preferably, the polymer comprises a triarylamine repeat unit. Particularly preferred triarylamine repeat units are shown in formulae 1-6:

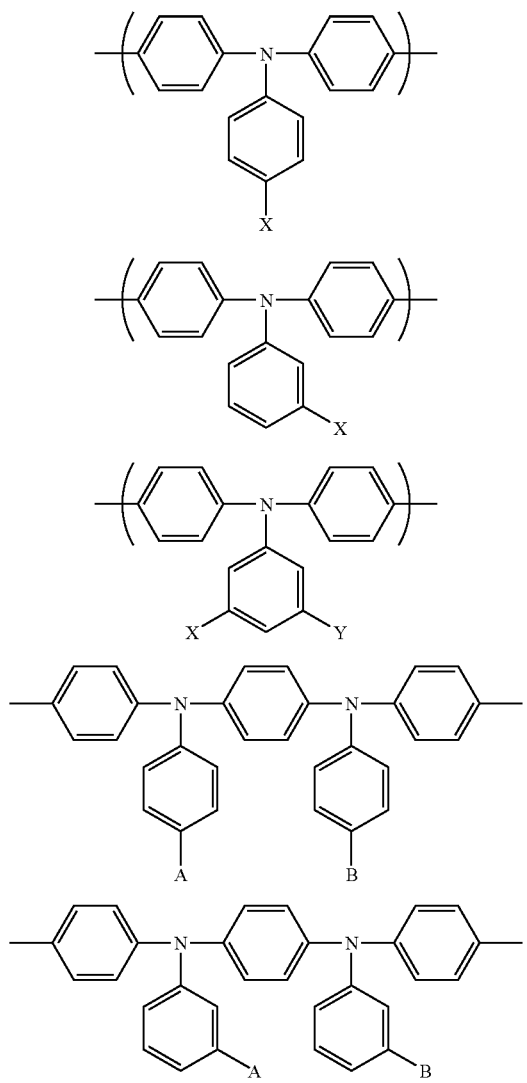

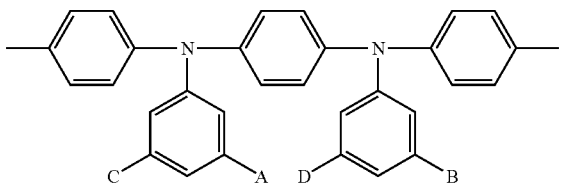

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The repeat unit of formula 1 is most preferred.

Most preferably, the polymer is a copolymer comprising one or more repeat units of formulae 1-6 and an arylene repeat unit. Particularly preferred arylene repeat units are optionally substituted fluorene, spirofluorene, indenofluorene, phenylene and oligo-phenylene repeat units.

A particularly preferred polymer for use as the blocking layer is "TFB" as disclosed in WO 99/54385:

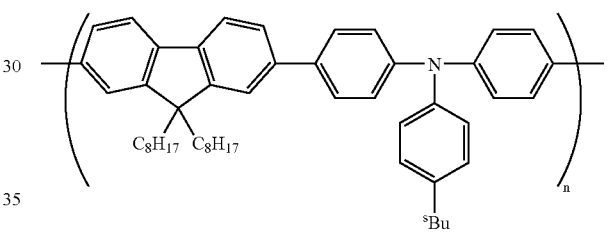

"TFB"

In another embodiment, the organic material of the blocking layer may comprise a small molecule. In still another embodiment, the organic material may comprise a dendrimer.

The organic material of the blocking layer is semiconductive.

More preferably, the organic material of the blocking layer comprises poly(9,9'-dioctylfluorene-co-bis-N,N'-(4-butylphenyl)diphenylamine) ("TFB").

In one embodiment, the blocking layer could comprise 2 'caps'; 1 over each of the source and drain electrodes. However, it is preferred that the blocking layer comprises a continuous layer over both the source and drain electrodes.

Preferably, the blocking layer is insoluble. This is advantageous for device manufacture, since, when the blocking layer is insoluble, a subsequent layer, typically the high mobility layer, can be deposited thereon by solution processing without losing the integrity of the blocking layer. Thus, it is desirable particularly for the blocking layer to be insoluble in a solvent that is suitable for depositing the subsequent layer of the device. Optionally, the blocking layer is rendered insoluble after deposition.

The blocking layer may be deposited during device manufacture by any suitable technique. For example, the blocking layer may be deposited by solution processing and subsequently converted to the insoluble blocking layer, such as by baking as disclosed in WO 04/023573 or cross-linking as disclosed in WO 96/20253. Following cross-linking or baking, the blocking layer may optionally be rinsed to leave a thin (10-20 nm) insoluble blocking layer behind.

The thickness of the blocking layer preferably is in the range of from 10 to 100 nm, more preferably from 10 to 30 nm.

The source and drain electrodes may comprise a metal or a conductive polymer. Preferred conductive polymers have a conductivity of at least $10^{-3}$ S/cm. The workfunction of the source and drain electrodes typically will be 5.1 eV.

A suitable metal is gold, having a workfunction of 5.1 eV.

A suitable conductive polymer is poly(3,4-ethylene-dioxythiophene) ("PEDOT") doped with a charge balancing counterion, preferably a polyanion, most preferably poly(styrene sulfonate) ("PSS"), the conductive polymer having a workfunction of 4.9-5.1 eV.

The source and drain electrodes may be deposited by any suitable technique, such as a suitable patterning technique. Suitable patterning techniques will be well known to a person skilled in this art and include shadow mask evaporation, photolithography, and ink jet printing.

The thickness of each of the source and drain electrodes preferably is in the range of from 10 to 80 nm, more preferably from 20 to 50 nm.

The gate electrode may comprise a metal or a conductive polymer. A preferred conductive polymer has a conductivity of at least $10^{-3}$ S/cm. A preferred polymer is poly(3,4-ethylenedioxy-thiophene) ("PEDOT") doped with a charge balancing counterion, preferably a polyanion, most preferably poly(styrene sulfonate) ("PSS"). A suitable metal is gold.

The gate electrode may be deposited by any suitable technique. Typically, the gate electrode is deposited using a patterning technique. Suitable patterning techniques will be well known to a person skilled in this art and include shadow mask evaporation, photolithography and ink jet printing.

The thickness of the gate electrode preferably is in the range of from 100 to 1000 nm, more preferably from 100 to 300 nm.

Referring to the insulating layer, preferably the insulating layer is solution processable.

Preferably, the insulating layer comprises an insulating polymer.

Turning to the high mobility layer, this has a charge carrier mobility of at least $10^{-2}$ cm$^2$/Vs, more preferably at least $10^{-1}$ cm$^2$/Vs. The mobility refers to the mobility of charge carriers, preferably holes.

The organic semiconductor of the high mobility layer preferably is solution processable, i.e. can be deposited from solution in a solvent. Suitable solution processing techniques include spin coating, blade coating and ink jet printing.

The organic semiconductor of the high mobility layer preferably comprises a polymer, more preferably a regio-regular polymer. In another embodiment, the organic semiconductor may comprise a small organic molecule such as a pentacene or a thiophene oligomer, for example sexithiophene, or a suspension of inorganic particles in solution such as CdSe nanocrystals in Chloroform.

Preferably, the organic semiconductor of the high mobility layer is doped, thus increasing its charge carrier mobility and its conductivity. Possible dopants are tetrathiofulvalene (TTF) and 2,3-dichloro-5,6-dicyano-1,4-benzoquinone (DDQ) as disclosed in Synth Met 68 pp 65 (1994). Suitable levels of doping are $10^{20}$-$10^{22}$ cm$^{-1}$ More preferably, the organic semiconductor of the high mobility layer comprises polythiophene and more preferably regio-regular polythiophenes.

Regio regular polymers are preferred. By 'regio-regular' is meant polymers having a side-chain/group pendant to the same point on the cyclic core group on each unit.

Conjugated polymers are preferred.

Still more preferably, the organic semiconductor of the high mobility layer comprises poly(3-hexylthiophene), preferably doped regio-regular poly(3-hexylthiophene).

The thickness of the high mobility layer preferably is in the range of from 10 to 100 nm more preferably from 20 to 50 nm.

Referring to the source and drain electrodes, in a top gate configuration, the source and drain electrodes may be fabricated on a substrate, such as a glass or polymer substrate.

More preferably, the insulating polymer comprises poly vinyl phenol, poly(methyl methacrylate) ("PMMA"), or poly vinyl alcohol.

The insulating layer preferably directly contacts the gate electrode.

The thickness of the insulating layer preferably is in the range of from 1 to 100 nm, more preferably from 10 to 50 nm.

In the on state, the source is usually held at zero volts. The gate and drain then may be at −10, −20, −40, up to −60V, however this will depend on the device. About −9V is of particular interest.

The transistor may be optically transparent.

The transistor may be a thin film transistor.

According to a further aspect of the invention there is provided a logic element, logic circuit, display or memory device comprising a transistor as set out above. The logic circuit may comprise a plurality of logic elements integrated on a single substrate.

According to a further aspect of the invention there is provided a logic circuit, display, sensor or memory device comprising an active matrix array of a plurality of transistors as set out above.

According to a further aspect of the invention there is provided a display comprising a plurality of display elements, at least one of the display elements being switched by an optically transparent thin film transistor.

A transistor as set out above is suitably located behind the display element.

Such a display may comprise an optically active region switchable by the transistor and the transistor is electrically coupled to the optically active region by means of conductive material located in a via hole formed through at least one layer of the transistor.

BRIEF DESCRIPTION OF THE DRAWING FIGURES

The invention now will be defined in more detail with reference to the attached figures in which:

FIG. 1 shows the transistor of Example 1.

EXAMPLE 1

Figure 1A:
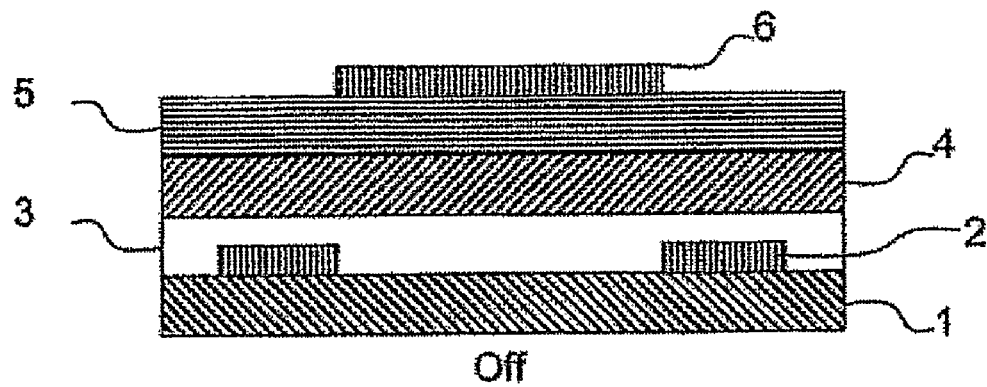
FIG. 1a shows the device in the off state and FIG. 1b shows the device in the on state.
Figure 1B:
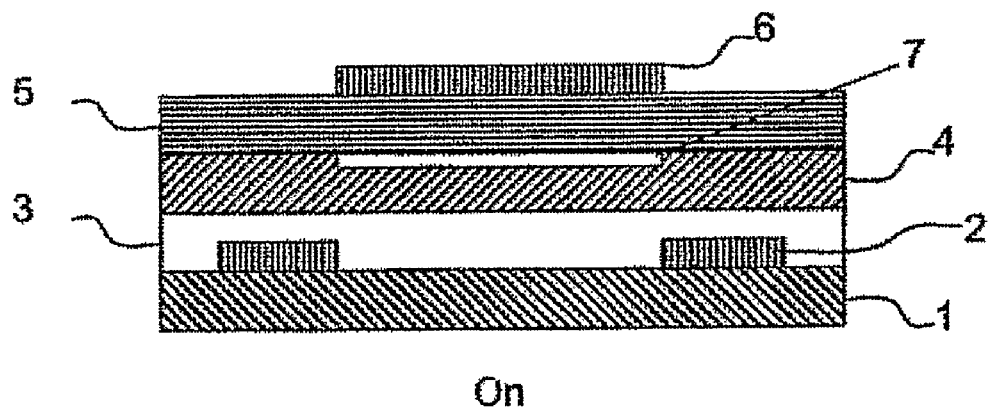
Figure 2:
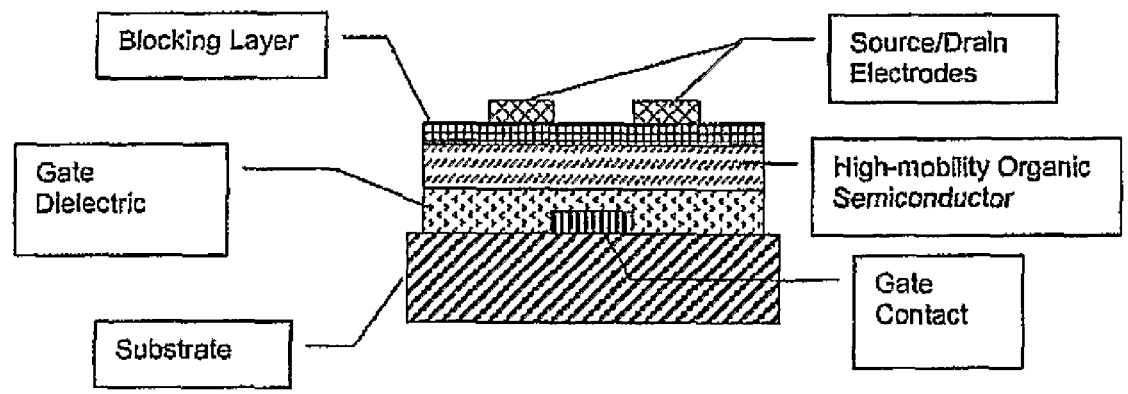
FIG. 2 shows a transistor in bottom gate configuration.

A glass or polymer substrate forms the base of the device (1). On top of this is deposited source and drain electrodes (2). These may be composed of metal or highly conductive polymer (PEDOT:PSS for example). The patterning of these electrodes may be through shadow-mask evaporation or photolithography or ink jet printing or another laterally defined patterning technique.

Next a layer of conjugated polymer which forms resistive contacts to the source/drain electrodes is deposited (3). This may be for example TFB or another polymer with an ionization potential (HOMO) greater than the work-function of the source and drain electrodes. This layer may be deposited by spin coating or ink jet printing or another method. This layer is then made insoluble through either baking as disclosed in WO 04/023573 or from cross linking. In the case of cross linking a thinner initial film will be required.

On top of the now insoluble first active polymer layer (3) a second high mobility layer is deposited (4). This layer can be solution deposited by spin-coating or ink jet printing or another solution deposition technique. The preferable material for this layer is regio-regular poly(3-hexylthiophene) and more preferably regio-regular poly(3-hexylthiophene) that has been doped so as to increase both its mobility.

On top of 4 is deposited an insulator (5). This may also be a solution processable material, such as poly vinylphenol or PMMA or poly vinylalcohol or another insulating polymer.

Finally a metallic gate electrode is deposited (6). This may be composed of metal or highly conductive polymer (PEDOT:PSS for example). The patterning of this electrode may be through shadow-mask evaporation or ink jet printing or another laterally defined patterning technique.

The invention claimed is:

1. A method of forming an organic transistor comprising:
   forming source and drain electrodes on a substrate;
   depositing a blocking layer of organic material directly onto the source and drain electrodes from solution, the ionization potential of the organic material of the blocking layer exceeding the work function of the source and drain electrodes so as to inhibit charge injection from the source electrode into the blocking layer, the blocking layer forming resistive contacts with the source and drain electrodes when the device is in the off-state;
   rendering the blocking layer insoluble in a solvent;
   depositing a high mobility layer of an organic semiconductor onto the blocking layer from the solvent which does not dissolve the blocking layer;
   depositing an organic insulating layer on the high mobility layer; and
   providing a gate electrode on the organic insulator layer.

2. The method according to claim 1, wherein the organic material of the blocking layer comprises a polymer.

3. The method according to claim 2, wherein the polymer of the blocking layer comprises poly(9,9'-dioctylfluorene-co-bis-N,N'-(4-butylphenyl)diphenylamine) ("TFB").

4. The method according to claim 1, wherein the organic semiconductor of the high mobility layer is solution processable.

5. The method according to claim 1, wherein the organic semiconductor of the high mobility layer comprises a polymer.

6. The method according to claim 1, wherein the organic semiconductor of the high mobility layer is doped.

7. The method according to claim 1, wherein the organic semiconductor of the high mobility layer comprises doped poly(3-hexylthiophene).

8. The method according to claim 1, wherein the source and drain electrodes comprise a metal or a conductive polymer.

9. The method according to claim 1, wherein the source and/or drain electrode comprises poly(3,4-ethylene-dioxythiophene): poly(styrene sulfonate) ("PEDOT:PSS").

10. The method according to claim 1, wherein the gate electrode comprises a metal or a conductive polymer.

11. The method according to claim 1, wherein the gate electrode comprises poly(3,4-ethylenedioxythiophene): poly(styrene sulfonate) ("PEDOT:PSS").

12. The method according to claim 1, wherein the insulating layer is solution processable.

13. The method according to claim 1, wherein the insulating layer comprises an insulating polymer.

14. The method according to claim 13, wherein the insulating polymer comprises poly vinyl phenol, poly(methyl methacrylate) ("PMMA"), or poly vinyl alcohol.

* * * * *